United States Patent [19]

Bernstein et al.

[11] Patent Number: 4,872,038
[45] Date of Patent: Oct. 3, 1989

[54] LATERAL SURFACE SUPERLATTICE HAVING NEGATIVE DIFFERENTIAL CONDUCTIVITY NOVEL PROCESS FOR PRODUCING SAME

[75] Inventors: Gary Bernstein, Tempe; David K. Ferry, Chandler, both of Ariz.

[73] Assignee: Arizona Board of Regents, Tempe, Ariz.

[21] Appl. No.: 159,721

[22] Filed: Feb. 24, 1988

[51] Int. Cl.$^4$ ............................................. H01L 27/12
[52] U.S. Cl. .......................................... 357/4; 357/16; 357/55
[58] Field of Search .......................... 357/4 SL, 16, 55

[56] References Cited

U.S. PATENT DOCUMENTS 4,503,447  3/1985  Inforte ..................................... 357/4
4,733,282  3/1988  Chang ...................................... 357/4

OTHER PUBLICATIONS

Zipperian, et al., *IDEM*83, pp. 696–699.

Primary Examiner—Martin H. Edlow
Attorney, Agent, or Firm—Richard R. Mybeck

[57] ABSTRACT

A lateral surface superlattice device having electronically created quantum wells which exhibits negative differential conductivity at ambient temperature and process for producing same.

21 Claims, 3 Drawing Sheets

LATERAL SURFACE SUPERLATTICE HAVING NEGATIVE DIFFERENTIAL CONDUCTIVITY NOVEL PROCESS FOR PRODUCING SAME

INTRODUCTION

This invention relates to semiconductor devices and more particularly to a lateral surface superlattice device having electronically created quantum wells and which exhibits negative differential conductivity due to Bloch oscillations as well as to a processes for producing same.

BACKGROUND OF THE INVENTION

Semiconductor devices having a superlattice structure in which there is a periodic variation in semiconductor composition are described in Esaki et al. U.S. Pat. Nos. 3,626,257 and 3,626,328, issued Dec. 7, 1971. These early superlattice devices comprised a one dimensional transport device formed by either doping or alloying techniques. Both methods of fabricating a superlattice structure involves epitaxially growing a semiconductor material which is periodically doped so as to produce alternating multi-thin layers having different band energies. These ultra-thin, well defined multi-layered semiconductor structures were advantageously fabricated by a process known as molecular beam epitaxy (MBE) by which smooth surfaces and extremely sharp boundaries at the interface of two closely lattice matched semiconductors can be produced with a minimum number of defects. The technique of molecular beam epitaxy is well known and has been described in, for example, L. L. Chang, et al., "Structures Grown By Molecular Beam Epitaxy", *J. Vac. Sci. Technology*, Vol. 10, No. 5, p. 655, September/October, 1973.

Another known fabrication technique involves the process of metallo-organic chemical vapor deposition (MOCVD) as described by N. Holonyak, *Journal of Applied Physics*, 1978, Vol. 49, p. 5392.

Another multi-layered semiconductor heterostructure having potential wells created between layers is disclosed in K. Hess et al. U.S. Pat. No. 4,257,055, issued Mar. 17, 1981. The Hess et al. device comprises an inner layer which exhibits high charge carrier mobility and a relatively narrow band gap characteristic while the outer sandwich layers exhibit low charge carrier mobilities and a larger band gap characteristic. In operation, under quiescent conditions, the charge carriers of the outer sandwich layers reside in the inner layer due to the potential well created by the band gap difference between layers. The application of an appropriate electric field to the central layer, aligned with the interface between the layers, causes a very rapid transfer of electrons residing therein to the outer sandwich layers, with the resulting transfer providing a negative resistance characteristic.

U.S. Pat. No. 4,503,477, issued Mar. 5, 1985 to G. J. Iafrate, T. A. Aucoin and David K. Ferry, discloses a superlattice semiconductor device consisting of a plurality of multi-dimensional charge carrier confinement regions of semiconductor material exhibiting a low band gap which is laterally located in a single planar layer of semiconductor material exhibiting a high band gap and wherein the confinement regions have sizes and mutual separation substantially equal to or less than the appropriate deBroglie wavelength. This device comprised a thin film of semiconductor material selected from group II-VI or III-V compounds or silicon having a plurality of laterally located, cylindrically shaped period regions or wells formed therein which are adapted to act as quantum well confinement regions for electrons. These regions are GaAs islands embedded in a GaAlAs matrix. While the device of Iafrate et al. provided an advance in the art, the periodic confinement regions were formed by the cumbersome prior art technique of applying high resolution lithography and selected anisotropic etching to write and etch a pattern of cylindrical cavities in the planar surface layer, followed by selective area epitaxial growth whereby the cavities are back filled with a semiconductor material having a smaller band gap to form a periodic arrangement of rows and columns of cylindrical wells. This technique does not presently lend itself to practical commercial production, and hence this device has not met with commercial success. Thus far, the prior art has failed to provide a multi-dimensional lateral superlattice device providing quantum well transport effects which can be readily fabricated and exhibit strong negative differential conductivity which may be attributed to the onset of Bloch oscillations.

Bloch oscillations are the cylindrical movement in real space due to bragg scattering of the electrons as they traverse the reduced zones formed by the two-dimensional superlattice created by the grid. Electrons undergoing Bloch oscillations do not contribute to total current transport, so that as more electrons Bloch oscillate, current decreases. This leads to a negative differential conductivity (NDC) effect.

The existence of Bloch oscillations has long been a subject of debate. Until now, there have been no reports of a direct observation of such a phenomenon. It is generally believed that devices specially designed to create Bloch oscillations can prove valuable in the study of superlattices and that these devices would exhibit negative differential conductivity (NDC). Such devices would permit the emission of electromagnetic radiation, and the oscillation frequency would be tunable through variations in the electric field along the channel. It is conceivable that frequencies as high as tens of terahertz could be generated in this manner.

The present invention meets this need by providing novel HEMTs which exhibit strong negative differential conductivity at ambient temperature, as well as methods of fabricating such devices without the need for growing the quantum wells epitaxially as required by the prior art. In addition, the quantum well height can be adjusted by changing the voltage applied to the gate grid, unlike the epitaxially grown devices.

One such device was briefly described in our prior publication, G. Bernstein and D. K. Ferry, "Fabrication of Ultra-Short Gate MESFETs and BlochFETS by Electron Beam Lithography", "*Superlattices and Microstructures*", Vol. 2, No. 4, pp 373–376, 1986. However, the HEMT described therein, designated as a Bloch-FET because the strong negative differential conductivity is believed to be attributable to Bloch oscillations, exhibited strong negative differential conductivity only at extremely low temperatures, 4.2 K. At higher temperatures, 77K and above, the device functioned as a conventional HEMT.

This early work was also reported in G. Bernstein and D. K. Ferry, "Negative differential conductivity in lateral surface superstructures", *J. Vac. Sci. Technol. B.* 5(4), Jul/Aug 1987, pp 964–966; and G. Bernstein and D. K. Ferry, "Observation of Negative Differential Conductivity in a FET with Structured Gate", *Z. Phys. B-Condensed Matter* 67, 449–452 (1987).

SUMMARY OF THE INVENTION

The present invention provides a novel high electron mobility transistor (HEMT) which exhibits strong negative differential at ambient temperature having quantum wells which are electronically created in a lateral surface superlattice which replaces the conventional gate of a high electron mobility transister (HEMT). The lateral surface superlattice gate serves to 3-dimensionally quantize the electrons.

The lateral surface superlattice grid depletes electrons from the interface only in areas directly beneath the metallized area. In the open regions of the grid, the electron density is not depleted, leaving electrons here in potential wells with respect to the depleted areas.

The process of the present invention employs electron beam lithography to pattern all fabrication levels and eliminates the need for selective area epitaxy to induce periodicity of the potential wells.

Accordingly, it is an object of the present invention to provide a lateral surface superlattice device which exhibits strong negative differential conductivity (NDC) at ambient temperatures.

It is also an object of this invention to provide a lateral surface superlattice having electronically created quantum well regions.

It is a further object of the invention to provide a lateral surface superlattice device which serves to 3-dimensionally quantize the electrons.

Another object of this invention is to provide a process for fabricating quantum well superlattice structures without epitaxially growing the quantum wells.

The term "LSSL", as used herein, refers to a lateral surface superlattice.

The term "HEMT", as used herein, refers to a high electron mobility transistor.

The term "NDC" as used herein, refers to negative differential conductivity.

The term "PMMA", as used herein, refers to polymethylmethacrylate.

The term "FET" refers to field effect transistor.

The term "BlochFET", as used herein, refers to a field effect transistor wherein the conventional gate has been replaced by a lateral surface superlattice structure which exhibits strong negative differential conductivity due to the onset of Bloch oscillations.

BRIEF DESCRIPTION OF THE DRAWINGS

These and further objects will be apparent from the following description and claims, taken in conjunction with the drawings in which:

DETAILED DESCRIPTION OF PREFERRED EMBODIMENTS

Figure 1:
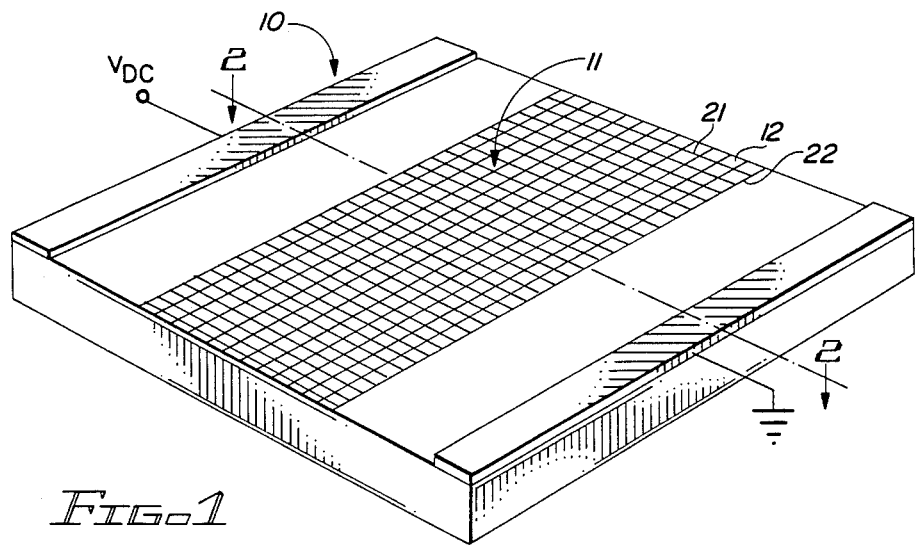
FIG. 1 is a perspective view of one embodiment of a lateral surface superlattice device in accordance with the present invention.

Referring to FIG. 1, lateral surface superlattice device 10 is a novel quantum device, designated as a BlochFET due to its strong negative differential conductivity believed to be attributable to Bloch oscillations. In its simplest terms, the device may best be described as a HEMT whose gate has been replaced by a lateral surface superlattice comprising grid structure 11 which three dimensionally quantizes electrons, thereby providing gate controlled negative differential conductivity. In operation, electrons are confined in both lateral directions parallel to the surface within quantum well 12.

Figure 2:
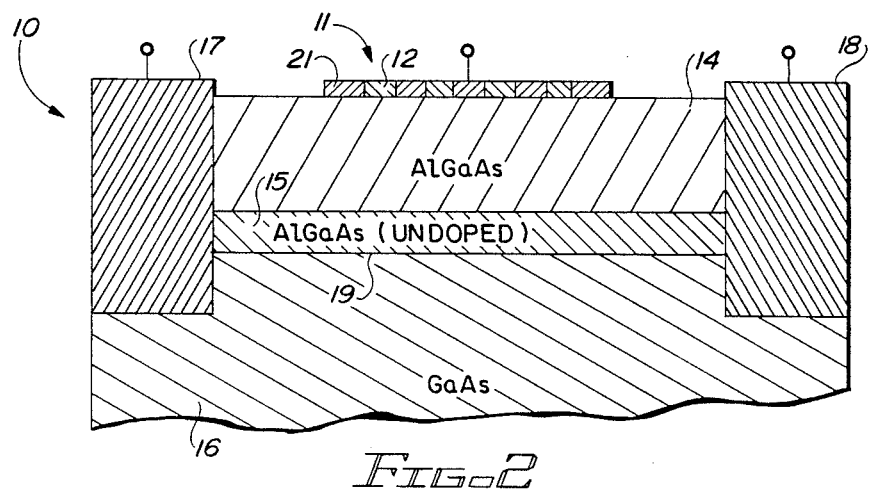
FIG. 2 is a cross-sectional view taken along lines 2—2 of FIG. 1.

Referring to FIG. 2, BlochFET 10 is fabricated from a typical modulation doped heterostructure material commonly employed for HEMTs. In one embodiment, a GaAs cap layer (not shown) was 7.5 nm thick doped with Si to $3.5 \times 10^{18}$ cm$^{-3}$. This was on a 30 nm thick AlGaAs first semiconductor layer 14 doped similarly to the cap layer. A 5 nm undoped GaAlAs layer 15 separated the latter layer from the undoped GaAs buffer layer 16.

All fabrication levels were patterned with electron-beam lithography. Trench isolated mesas and bonding pads were exposed in a 300 μm field while patterns on the mesa, including the gate grid (FIG. 3) were exposed in an 89 μm field. Source and drain ohmic contacts 17 and 18 were formed from AuGe eutectio with a Ni overlayer, alloyed for 5 min at 450° C. The source-drain spacing was 9 μm,. In order to allow gate grid 11 to sit closer to the conducting channel 19, the cap layer was completely etched away between the source 17 and drain 18.

Figure 3:
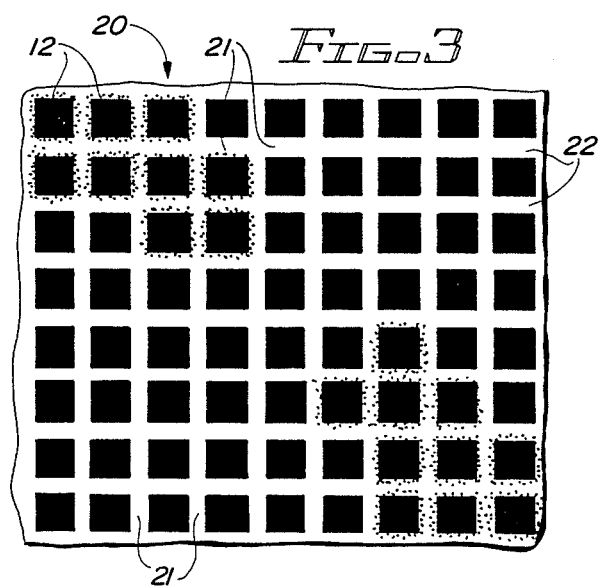
FIG. 3 is a top view of a device of this invention depicting one embodiment of the grid structure used for the gat electrode.

Referring to FIG. 3, a modified scanning electron microscope with a 40 kV beam was employed to expose a 100 nm PMMA (polymethylmethacrylate) resist layer to form the grid pattern 20 comprising regularly spaced apart vertical grid lines 21 and horizontal grid lines 22 which define quantum well structure 12 therebetween. In a preferred embodiment, thermally evaporated Shottky metal was "lifted off" to provide the grid structure. In one embodiment, the grid consisted of nominally 40 nm lines on a 170 nm pitch and were 20 nm thick. The grids were 28 periods in the source drain direction by 170 periods perpendicular making them about 5 μm long by 30 μm wide.

The grid may be formed of any metal which forms a Schottky barrier. Suitable metals include, but are not limited to gold, nickel, platinum, titanium, aluminum and palladium.

While the grid pattern depicted in FIGS. 1 and 3 comprises an essentially square pattern, the grid may be fashioned in a variety of configurations, including, but not limited to, rectangular, circular, ovoid, diamond shaped, etc.

Figure 4:
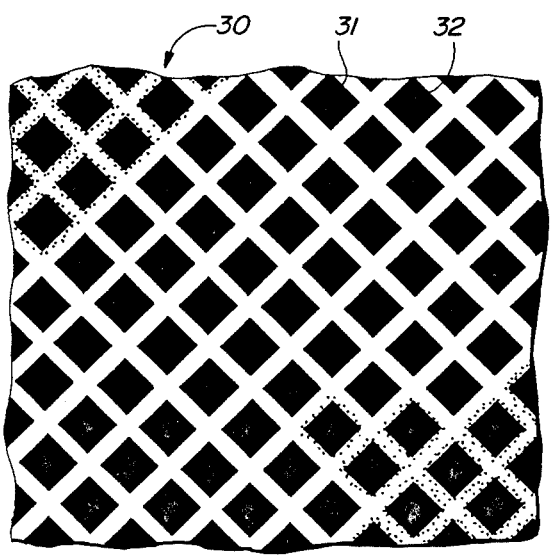
FIG. 4 is a top view of a device of this invention showing an alternate embodiment of the grid structure.
Figure 5:
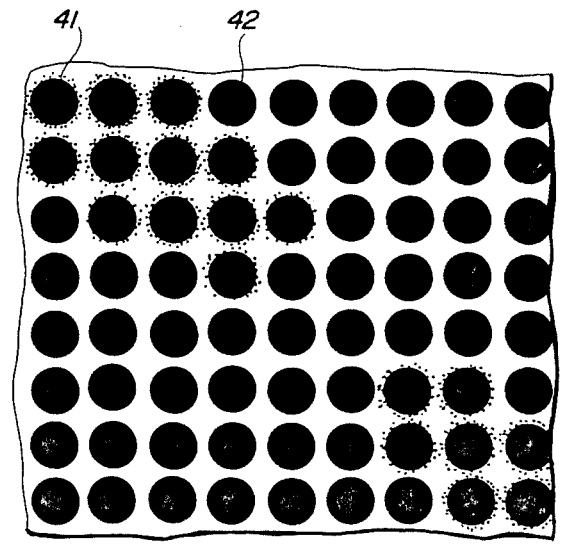
FIG. 5 is a top view of a device of this invention showing yet another alternate embodiment of the grid structure.

In FIG. 4, BlochFET 30 has a diamond patterned grid 31 which forms diamond shaped quantum well regions 32. Yet another alternate embodiment is depicted in FIG. 5 wherein the gate grid 41 defines circular or ovoid quantum wells 42.

The number of electron states in the quantum well and the temperature at which the device of this invention operates as a BlochFET which exhibits strong negative differential conductance due to Bloch oscillation effects may be varied by varying the grid spacing. Our first such device exhibited strong negative differential only at liquid helium temperature (4.2K) which is not satisfactory for most uses.

We have now found that in order to produce a HEMT or FET which exhibits strong negative differential conductivity at ambient temperatures, the periodicity must be less than 800 Å. Generally speaking, the period must be smaller than the mean free path of the electrons. The smaller the spacing, the higher the operating temperature of the device and vice versa. In the early device which only exhibited negative differential conductivity at extremely low temperature, the approximate mean free path was approximately 2000 Å.

Thus, while the shape of the quantum well regions defined by the grid structure is not critical to the induction of periodicity, the grid spacing is critical, as discussed above, in determining the operating temperature and characteristics of the superlattice device of this invention.

Figure 6:
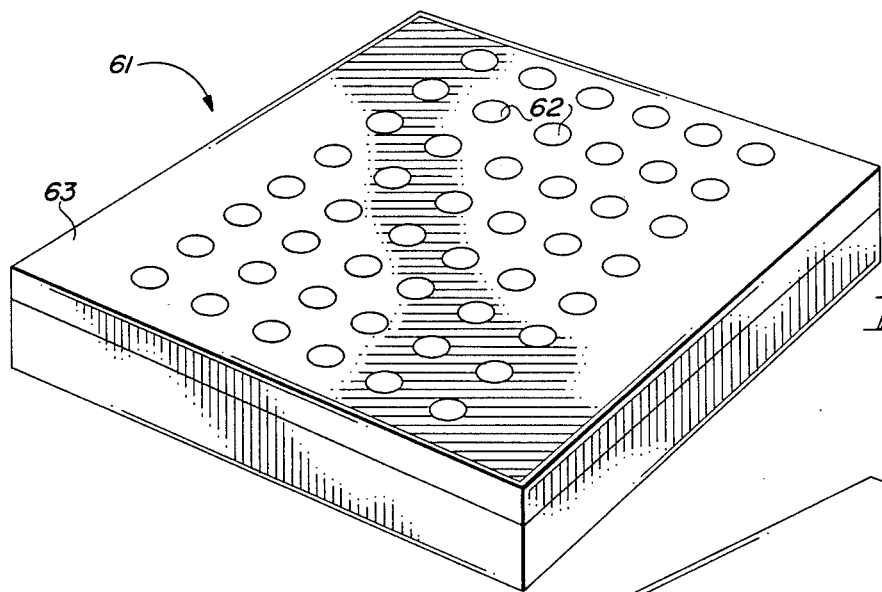
FIG. 6 is a perspective view of the gate of the preferred embodiment under construction in which a two-dimensional superlattice array of Schottky metal dots is placed on the surface of the first layer to produce a superlattice potential along the interface at the inversion layer.

Referring to FIG. 6, in the preferred embodiment of this invention, gate 61 of BlochFET 60 comprises a two-dimensional superlattice array of Schottky barrier metallic dots 62 placed within the gate oxide 63. This dot array produces a superlattice potential along the interface at the inversion layer. In the presently preferred embodiment, small gold dots are used as masks for a plasma etching scheme.

Figure 8:
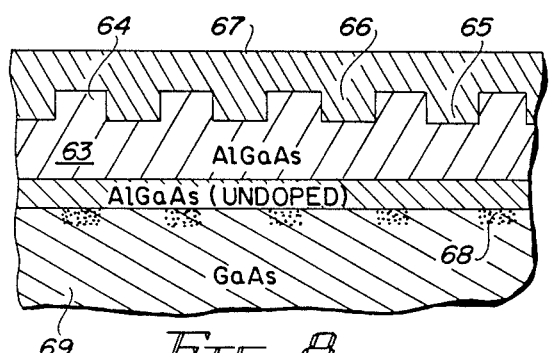
FIG. 8 is a section view taken along lines 8—8 of FIG. 6.
Figure 7:
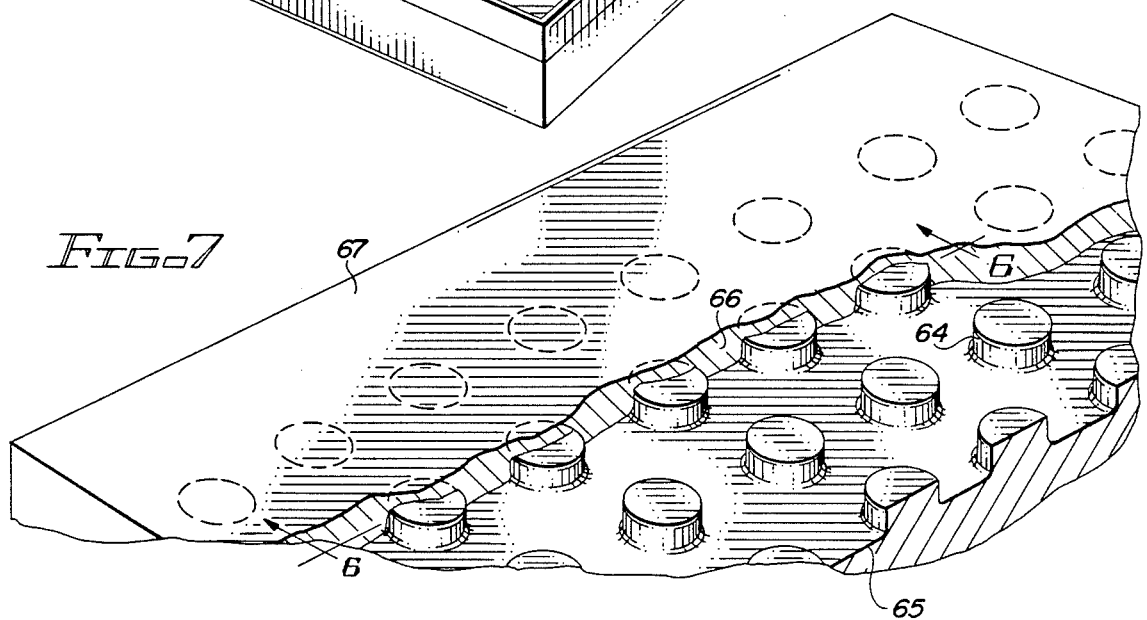
FIG. 7 is a perspective view of the device of FIG. 6 following plasma etching and metallization with portions cut away for clarity.

As best shown in FIGS. 7 and 8, after etching, the dots are left as pillars 64 and the resulting holes 65 are filled with gold or another suitable metal 66 which provides a Schottky barrier. In this device, the Schottky metal fills the holes surrounding the pillars and covers the pillars themselves, forming superlattice grid top layer 67. A clump of electrons 68 form potential quantum wells as best shown in FIG. 8. The method of producing the preferred embodiment of this invention permits closer, more precise spacing of the grid, and hence greater flexibility in designing and controlling the characteristics and operating temperatures of the device.

Figure 9:
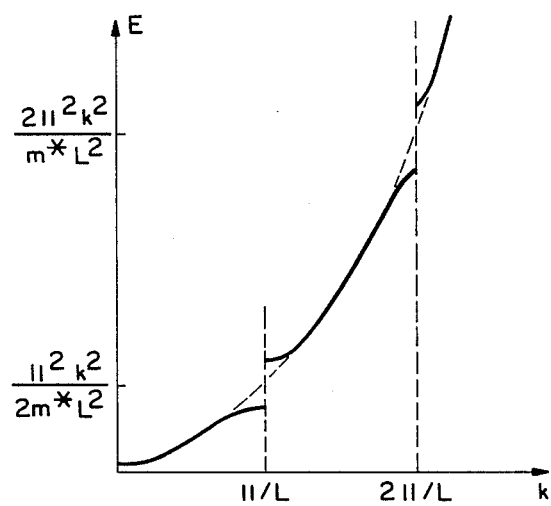
FIG. 9 is a graph showing the general conduction band energy structure of a device of this invention.

FIG. 9 graphically depicts the general conduction band energy structure of a device of this invention. Gaps are opened at $k=\pi/L$ (where L is the periodicity of the LSSL) due to the perturbation of the surface superlattice potential.

D.C. current-voltage characteristics were obtained at room temperature, 77K and lower. At room temperature and 77K, the drain characteristics of the device having the dimensions described in conjunction with FIG. 2 were typical of standard field effect transistors. A device tested at liquid helium temperature, 4.2K, on the other hand, displayed pronounced NDC regions which increased in magnitude with increased reverse gate bias.

Figure 10:
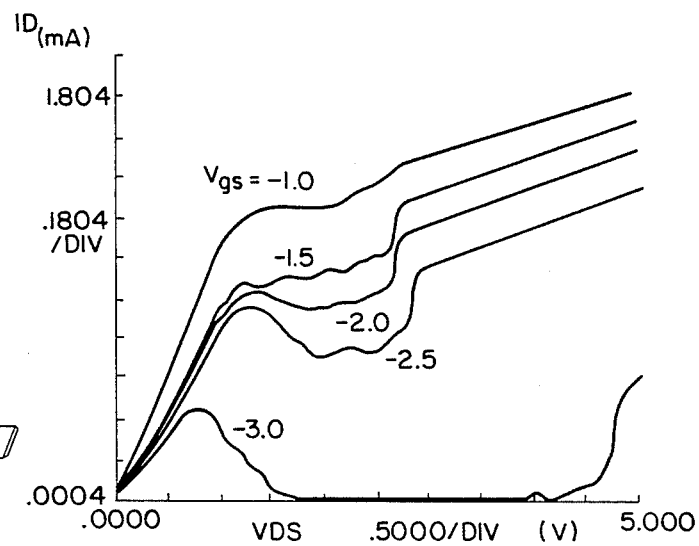
FIG. 10 is a graph showing the experimental current-voltage characteristics for a BlochFET at 4.2K.

FIG. 10 graphically illustrates the currentvoltage characteristics of the BlochFET formed in a GaAS MODFET at low temperatures (4.2K). The gate is the grid shown in FIGS 1 and 3, and imposes a lateral surface superlattice onto the inversion layer at the GaAs/GaAlAs interface. Especially at the most negative gate voltage, the curves show exactly the behavior expected for transport and Bloch oscillations in the minibands. As the drain electric field is increased, but remains below that needed for interband tunneling, an increasing number of electrons are expected to oscillate and, hence, are removed from the current carrying process. This proceeds at increasingly higher fields until a large fraction of electrons are oscillating and total current decreases appreciably.

Figure 11:
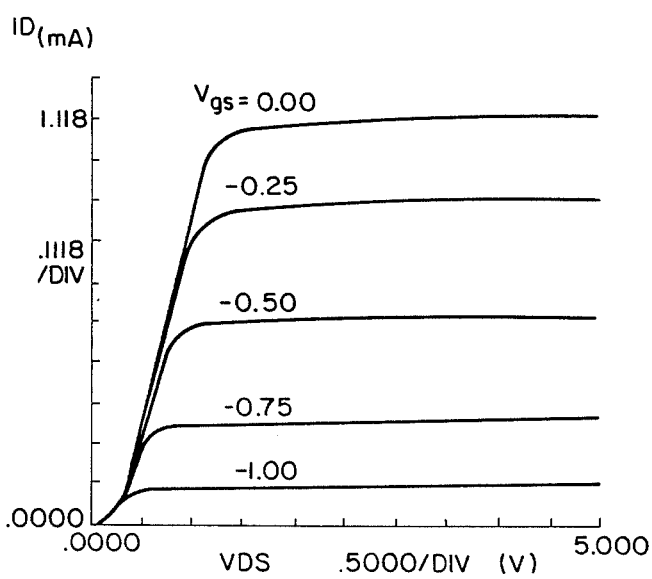
FIG. 11 is a graph showing the experimental current-voltage characteristics for a solid gate HEMT at 4.2K wherein the gate has the same total dimensions as the BlochFET grid.

In order to rule out effects from the test fixture, devices were fabricated from the same material employing a solid gate of the same total dimensions as the grid. These were tested identically to the BlochFET. As shown in FIG. 11, these curves show no evidence of NDC. It can be seen that the pinchoff voltage in this material is slightly more than $-1$ volt for the solid gate device. It is seen in FIG. 12, however, that as much as $-3$ volts is not sufficient to stop drain current in BlochFET 10 indicating that charge still exists in the wells. This can be understood from the depletion length in this highly doped material. It is expected that no current would flow unless the wells 23 were quantum mechanically coupled.

The striking feature of the BlochFET curves is the strong NDC evident at high reverse gate voltages. These features can be further explained as follows. When the device is near pinchoff, the electrons in the channel are more fully localized in weakly coupled quantum boxes. Thus, there is a strong superlattice potential, which is strength, end by the localization of the electrons in the boxes. As the gate potential is made more positive and channel density is increased, the superlattice potential is weakened by the screening of the background carrier density. Since the Fermi level enters the conduction band where there is a high density of carriers, there is relatively little potential modulation along the surface. It is only when the 2-DEG is depleted under the metal that the conduction band is raised sufficiently relative to the Fermi level and the bands bent enough to create the LSSL. To observe the mini-band effects, the electrons must have an inelastic mean free path length that is longer than the period of the surface superlattice. The mobility in these layers was such that the mean free path is estimated to be about 2000 Å, so that the effect is seen only at the lowest temperatures in the device of FIG. 2.

While the structures of this invention have been shown as comprised of GaAs and GaAlAs, other semiconductor materials can be utilized when desirable and when selectively chosen from groups II-VI or III-V compounds or silicon.

The lateral surface superlattice device of the present invention offers conceptual as well as technological advantages over the layered superlattice of the prior art in terms of achieving the desired quantum-well transport effects. In essence, the reason for this is that the mini-bands in the one-dimensional layered superlattices are not separated by real mini-gaps, but are "connected" by the two-dimensional transverse continuum of states. Electrons can avoid the mini-gaps by scattering to higher energies in directions parallel to the superlattice planes. In order to create true mini-gaps, a multi-dimensional superlattice of quantization is required. This can be achieved by a lateral superlattice imposed in a quantized inversion layer.

The application of a gate potential to control the band structure is especially advantageous. Gaps in the conduction band can be varied for application as a tunable detector of infrared radiation. In addition, if Bloch oscillations are shown to be coherent, emission of electromagnetic radiation would be possible. Further, the oscillation frequency would be tunable through variations in the electric field. It is conceivable that frequencies as high as tens of terahertz could be generated in this manner. In addition, the very large peak-to-valley ratios attainable by devices in accordance with the BlochFET of the present invention, make them excellent candidates as high frequency oscillators and amplifiers.

The foregoing description has been made by way of illustration and accordingly all modifications, alterations and changes falling within the spirit and scope of the invention as set forth in the appended claims is meant to be included herein.

We claim:

1. A lateral surface superlattice device which exhibits negative differential conductivity at ambient temperatures, said superlattice device comprising: a first layer, said first layer being a thin, uniform planar layer of a first type of semiconductive material having an upper surface, a lower surface and opposing ends; a second layer of a second type of semiconductive material exhibiting predetermined energy gaps between the conduction and valence bands of said first and second types of semiconductive materials; conducting channel means separating said first and second layers of dissimilar semiconductor materials; a conducting channel formed between said first and second semiconductor layers; gate means received and positioned within a central portion of said upper surface of said first layer and communicating with said channel means, said gate comprising an open Schottky metal grid defining a gate pattern having a plurality of spaced-apart apertures within said pattern, each of said apertures separated on all sides by a Schottky metal wall; a plurality of electronically created, multi-dimensional charge carrier confinement regions laterally disposed within said cap layer and defined by said the walls of each aperture in said grid, said electronically created confinement regions serving as quantum wells having a periodicity of less than 800 Å.

2. The device of claim 1 wherein said first and second types of semiconductor materials are selected from group II-VI semiconductor materials.

3. The device of claim 1 wherein said first and second types of semiconductor materials are selected from Group III-V semiconductor materials.

4. The device of claim 1 wherein said first layer of semiconductive material is comprised of a relatively thin, generally uniform layer of $Ga_xAl_{1-x}As$ and second layer is comprised of GaAs.

5. The device of claim 1 additionally comprising drain and source electrodes at opposite ends of the upper surface of the device, and gate contact means cooperating with said drain and source electrodes and the gate formed by the central portion of said first layer to provide a transistor.

6. The device of claim 4 additionally comprising drain and source electrodes at opposite ends of the upper surface of the device, and gate contact means cooperating with said drain and source electrodes and the gate formed by the central portion of said first layer to provide a transistor.

7. A lateral surface superlattice device which exhibits negative differential conductivity, said superlattice device comprising: a first layer, said layer being a thin, uniform planar layer of a first type of semiconductive material having an upper surface, a lower surface and opposing ends; a plurality of spaced apart pillars disposed in a two-dimensional pattern within a central portion of the upper surface of said first layer, said pillars extended above the upper surface of said first layer, channels formed by the interstices between said pillars, said channels filled with a Schottky metal, said metal covering the tops of said pillars so as to form a continuous Schottky metal surface over said central portion of said first semiconductor layer; a second layer of a second type of semiconductive material exhibiting predetermined energy gaps between the conduction and valence bands of said first and second types of semiconductive materials; conducting channel means separating said first and second layers of dissimilar semiconductor materials; said central portion of said upper layer serving to forming a plurality of electronically created quantum wells.

8. The device of claim 7 wherein said first and second types of semiconductor material are selected from group II-VI semiconductor materials.

9. The device of claim 7 wherein said first and second types of semiconductor material are selected from group III-V semiconductor materials.

10. The semiconductor device of claim 7 wherein said first layer of semiconductive material is comprised of a relatively thin, generally uniform layer of $Ga_xAl_{1-x}As$ and second layer is GaAs.

11. The device of claim 7 additionally comprising drain and source electrodes at opposite ends of the upper surface of the device, and gate contact means cooperating with said drain and source electrodes and the gate formed by the central portion of said first layer to provide a transistor.

12. The device of claim 10 additionally comprising drain and source electrodes at opposite ends of the upper surface of the device, and gate contact means cooperating with said drain and source electrodes and gate to provide a transistor.

13. The device of claim 7 wherein the periodicity of the spaces between said pillars is less than 800 Å.

14. The device of claim 11 wherein the periodicity of the spaces between said pillars is less than 800 Å.

15. The device of claim 12 wherein the periodicity of the spaces between said pillars is less than 800 Å.

16. A high electron mobility transistor having a lateral superlattice structured gate which exhibits negative differential conductivity, said transistor comprising: a first layer, said layer being a thin, uniform planar layer of a first type of semiconductive material having an upper surface, a lower surface and opposing ends; a plurality of spaced apart pillars disposed in a two-dimensional pattern within a central portion of the upper surface of said first layer, said pillars extended above the upper surface of said first layer, channels formed by the interstices between said pillars, said channels filled with a Schottky metal, said metal covering the tops of said pillars so as to form a continuous Schottky metal surface over said central portion of said first semiconductor layer; a second layer of a second type of semiconductive material exhibiting predetermined energy gaps between the conduction and valence bands of said first and second types of semiconductive materials; conducting channel means separating said first and second layers of dissimilar semiconductor materials; said central portion of said upper layer serving to forming a plurality of electronically created quantum wells; drain and source electrodes at opposite ends of the upper surface of the device, and gate contact means cooperating with said drain and source electrodes and the gate formed by the central portion of said first layer.

17. The device of claim 16 wherein said first and second types of semiconductor material are selected from group II-VI semiconductor materials.

18. The device of claim 16 wherein said first and second types of semiconductor material are selected from group III-V semiconductor materials.

19. The semiconductor device of claim 16 wherein said first layer of semiconductive material is comprised of a relatively thin, generally uniform layer of $Ga_xAl_{1-x}As$ and second layer is GaAs.

20. The device of claim 16 wherein the periodicity of the spaces between said pillars is less than 800 Å.

21. The device of claim 19 wherein the periodicity of the spaces between said pillars is less than 800 Å.

* * * * *

UNITED STATES PATENT AND TRADEMARK OFFICE
CERTIFICATE OF CORRECTION

PATENT NO. : 4,872,038
DATED : October 3, 1989
INVENTOR(S) : David K. Ferry et al It is certified that error appears in the above-identified patent and that said Letters Patent is hereby corrected as shown below:

Col. 1, line 5 insert the following:

---This invention was made with Government support under contract No. N 00014-84-K-0053 awarded by the Department of the Navy.
The Government has certain rights in the invention.---

Signed and Sealed this

Twenty-second Day of September, 1992

Attest:

DOUGLAS B. COMER

Attesting Officer

Acting Commissioner of Patents and Trademarks